United States Patent [19]

Komatsu

[11] Patent Number: 5,654,242

[45] Date of Patent: Aug. 5, 1997

[54] METHOD FOR MAKING REFRACTORY METAL SILICIDE ELECTRODE

[75] Inventor: Hiroshi Komatsu, Kanagawa, Japan

[73] Assignee: Sony Corporation, Tokyo, Japan

[21] Appl. No.: 533,017

[22] Filed: Sep. 25, 1995

[30] Foreign Application Priority Data

Sep. 28, 1994 [JP] Japan ................................. 6-233098
Feb. 14, 1995 [JP] Japan ................................. 7-025220

[51] Int. Cl.$^6$ .................................................. H01L 21/28
[52] U.S. Cl. ........................... 438/585; 438/658; 438/660
[58] Field of Search ................................. 437/200, 201, 437/193, 45

[56] References Cited

U.S. PATENT DOCUMENTS

| | | | |
|---|---|---|---|
| 4,597,163 | 7/1986 | Tsang | 437/200 |
| 4,966,869 | 10/1990 | Hillman et al. | 437/200 |
| 5,231,056 | 7/1993 | Sandhu | 437/200 |
| 5,395,787 | 3/1995 | Lee et al. | 437/41 |
| 5,459,101 | 10/1995 | Fujii et al. | 437/200 |
| 5,500,249 | 3/1996 | Telford et al. | 437/200 |

FOREIGN PATENT DOCUMENTS

| | | |
|---|---|---|
| 591086 | 4/1994 | European Pat. Off. . |
| 56-094668 | 7/1981 | Japan . |
| 02237073 | 9/1990 | Japan . |

*Primary Examiner*—John Niebling
*Assistant Examiner*—Thomas G. Bilodeau
*Attorney, Agent, or Firm*—Hill, Steadman & Simpson

[57] ABSTRACT

A $WSi_x$ layer wherein the value of x as the stoichiometry of Si is not less than 2.7 and preferably not less than 3.0 is formed by LPCVD based upon reduction of $SiCl_2H_2$ of $WF_6$. Even if this $WSi_x$ film is used without an adhesion layer such as poly Si (polycide structure), it is excellent in adhesion with respect to an $SiO_2$ film and provides a gate electrode capable of maintaining a satisfactory breakdown voltage value of a gate oxide film. If n-type and p-type impurities are ion-implanted into an nMOS forming region and a pMOS forming region of the $WSi_x$ layer and patterned, a gate electrode of a reduced thickness and a low resistance having a controlled work function may be formed for providing symmetrical threshold voltages.

9 Claims, 15 Drawing Sheets

METHOD FOR MAKING REFRACTORY METAL SILICIDE ELECTRODE

BACKGROUND OF THE INVENTION

1. Field of the Invention

This invention relates to a method for forming a gate electrode employed in a semiconductor device, such as a MOS transistor. More particularly, it relates to a method for forming the gate electrode in which the gate electrode is formed solely by a refractory metal silicide film for satisfying requirements for low cost, low resistance, superior adhesion or high gate voltage withstand characteristics and in which the work function of the gate electrode is controlled for improving the driving capability and accommodation to high degree of size refinement.

2. Description of the Related Art

A complementary MOS transistor (CMOS) circuit, in which an n-type MOS transistor (nMOS) and a p-type MOS transistor (pMOS) are present on one and the same substrate, has such merits that the power consumption is low since the current flows only when both transistors are on, while it lends itself to size refinement or high integration due to its structure and can be operated at a high operating speed. Thus the circuit is extensively used as many LSI constituent elements including memory or logic devices.

The CMOS circuit may be formed not only on a bulk substrate but also on a silicon-on-insulator (SOI) substrate which assures complete device isolation. The use of the SOI substrate having an Si active layer with a thickness on the order of 500 nm leads to suppression of errors in software or to suppression of latch-up, which is a deleterious conduction phenomenon proper to the CMOS circuit, as has been shown since earlier stages of investigations. In addition, it has recently been shown that, if the Si active layer is reduced in thickness to about 100 nm and the channel impurity concentration is lowered to about $1 \times 10^{17}/cm^3$ or less for substantially depleting the Si active layer along its thickness, it becomes possible to achieve desirable performance, such as suppressed low-channel effect or improved current driving capability.

As for gate electrodes of recent MOS transistors, there are two outstanding motifs for researches, namely (i) selection of constituent materials, and (ii) control of the work function for coping with size refinement.

The selection of constituent materials of the motif (i) is explained. As the gate electrode materials for MOS transistors, an $n^+$type polysilicon film or a polycide film comprised of the $n^+$type polysilicon film layered thereon has hitherto been used. The $n^+$polysilicon film is employed since it can withstand a high-temperature process satisfactorily. However, the sheet resistance of the $n^+$type polysilicon is as high as approximately 100 ohm/□ for the film thickness of 100 nm, such that, with progress in LSI size refinement and high integration degree, signal delay due to metallization resistance of the polysilicon gate electrode has been increased to a level which is not negligible in association with the operating speed of LSI. Under such situation, attention has been directed to a refractory metal silicide having a post-annealing resistance about one order smaller than that of the impurity-containing polysilicon layer. Typical of the refractory metal silicide s tungsten silicide ($WSi_x$). In addition, this material has a work function larger than that of the impurity-containing polysilicon film and is promising for controlling the threshold voltage $V_{th}$ by the work function. However, the $WSi_x$ film is not employed as a single layer in the gate electrode for the following reason.

First, the $WSi_x$ film is poor in adhesion with respect to an $SiO_2$ film. If, for example, the $WSi_x$ film is formed by so-called silane reduction CVD, the film is highly susceptible to exfoliation, although irradiation damages to the underlying $SiO_2$ film may be suppressed satisfactorily in distinction from the case of employing sputtering for deposition in place of CVD. The reason is that F atoms are usually contained in a number on the order of $10^{20}/cm^3$ in the $WSi_x$ film deposited by silane reduction CVD such that the bonds of Si atoms, which should be bonded to O atoms of the $SiO_2$ film, are consumed by F-atoms.

The second problem is that the $WSi_x$ film is poor in oxidation and susceptible to crack. With a system such as $WSi_x$ in which W and Si co-exist, there is a probability that Si be oxidized first to form a stable $SiO_2$ film on its surface. With a system in which Si is supplied in an abundant quantity from outside, the surface of the $WSi_x$ can be protected by this $SiO_2$ film. However, with the $WSi_x$ alone, the $SiO_2$ film having a sufficient film thickness to achieve surface protection is not produced, as a result of which volatile $WO_x$ is yielded thus embrittling the produced film.

For the above reason, the $WSi_x$ film is not used alone with the generation since the submicron generation (0.7 to 0.8 µm) but is used extensively used in the from of a so-called W-polycide film (tungsten polycide film) comprised of the $WSi_x$ film layered on the $n^+$polysilicon layer as a gate electrode material or a multi-layer metallization material for a memory/logic type device. This is based upon a concept that the polysilicon film which is proven through use and whose characteristics are well-known should be used for an interface with the underlying $SiO_2$ film and the $WSi_x$ film layered thereon should be responsible for reducing the resistance.

Next, control of the work function associated with size refinement (ii) is explained.

One of the reasons the $n^+$type polysilicon film or the polycide film having the refractory metal silicide film layered thereon has hitherto been used as a constituent material for the gate electrode of the MOS transistor is that, since the channel profile is of the buried type, the operating speed may be increased by taking advantage of high bulk mobility, in addition to the fact that heat resistance may be increased as described above. However, since the foremost portions of the depletion layer, protruded form the source/drain region, approach each other in the recessed substrate portion under the effect of the gate electrical field, so that the problem of punch-through tends to be produced. Consequently, with a generation in which the design rules is reduced to lower than a deep submicron range, it becomes difficult with the buried channel type to suppress short channel effects. Therefore, a surface channel type MOS transistor is desired.

It is further demanded of the CMOS that the threshold voltage Vth of nMOS be symmetrical with respect to that of pMOS. With the conventional CMOS circuit employing $n^+$type polysilicon film for the gate electrodes of both the nMOS and the pMOS, there is a difference in work function between nMOS and pMOS and, due to such difference, the threshold voltages Vth become non-symmetrical relative to each other. In order for the signal transfer characteristics to be symmetrical relative to each other in case of constituting the basic gate by the CMOS invertor, the Vth values of the two transistors need to be symmetrical relative to each other. Usually, boron is ion-implanted to a shallow depth in the pMOS region for setting the Vth values of the two transistors substantially equal to each other (usually, 1 V or less). However, if the impurity concentration in the vicinity of the substrate surface is increased by ion implantation for Vth adjustment, the carrier mobility in the vicinity of the substrate surface is lowered, which is deleterious to increasing the operating speed.

Similar problems arise with the MOS transistor on the SOI substrate. That is, if attempts are made for setting the value of Vth of the nMOS having the n$^+$polysilicon gate electrode to 0.5 to 1.0 V as required for the enhancement type transistor, the required channel impurity concentration is raised to a value exceeding $10^{17}/cm^3$.

If the device size is refined to a gate length level of 0.1 µm, the absolute number of channel impurity atoms contributing to Vth control per transistor is decreased, such that Vth fluctuations die to statistic variations cannot be relatively neglected, as reported in 1994 Symposium on VLSI technological abstracts, lecture numbers 2.3. In short, there is a certain limit in Vth control employing channel impurity in which the problem of obstructions to high operating speed or fluctuations is inevitably produced. Therefore, if the channel profile is to be of a surface type, and optimum Vth control is to be achieved in the low channel impurity concentration range, it is imperative to control the work function of the gate electrode.

As a specific example of the Vt control by the work function, there is presently known a so-called dual gate type CMOS in which an n$^+$type polysilicon film and a p$^+$type polysilicon film are used as the gate electrode for the nMOS and the gate electrode for the pMOS, respectively.

In 1994 Symposium on VLSI technological abstracts, lecture number 2.2, there is shown a p$^+$-n$^+$double gate type MOS transistor. This MOS transistor, employing a p$^+$type polysilicon film for a front gate electrode and an n$^+$type polysilicon film as a back gate electrode, has succeeded in lowering Vth to less than 0.3 V, while suppressing short channelling effects.

In 1993 IEDM abstracts, lecture number 30.2.1, there is shown a MOS transistor of fully depletion type susceptible to only small Vth fluctuations with temperature in which Vth is lowered to near 0.15 V even although the channel impurity concentration is low.

In 1985 IEDM abstracts, lecture number 15.5, there is shown a CMOS employing a Si-rich MoSi$_x$ gate electrode doped with an impurity on the order of $1+10^{12-15}$. With the CMS, a non-degradable Si layer whose change in Fermi level depends on temperature is segregated in the interface between the MoSi$_x$ film and the gate oxide film for compensating for variation in Vth due to temperature.

However, the W-polycide film, put to practical application under the above-described circumstances, and the Vth control by the work function envisaged up to now, suffer from the following drawbacks.

The problem inherent in the W-polycide film is first discussed.

The W-polycide film is difficult to work anisotropically by dry etching. The reason is that the main etching species of the upper layer side WSi$_x$ is chlorine, while the main etching species for the lower layer side polysilicon film for high selectively etching of polysilicon is bromine, such that the optimum etching conditions differ between the two films, and hence a multi-step process of switching the etching conditions partway becomes necessary if anisotropic etching is to be achieved with the two films. However, with reduction in thickness of the gate electrode, only a small margin is left for switching timing shift, while timing judgment itself becomes difficult with increase in surface steps. Therefore, the W-polycide film is difficult to etch unless the dry etching device exhibits markedly high controllability.

Second, the polysilicon surface needs to be rinsed meticulously before formation of the WSi$_x$ film. During formation of the W-polycide film, the wafer needs to be opened to atmospheric air after forming the polysilicon film. For layering the WSi$_x$ film with good adhesion, it is necessary to remove a native oxide film grown on the polysilicon film surface during the time the polysilicon film is exposed to atmospheric air. The native oxide film is usually removed by dip washing of dipping the wafer in a dilute aqueous solution of hydrofluoric acid. A so-called water mark, a phenomenon in which the native oxide film is left on a wafer portion on which liquid droplets are affixed during wafer drying, is produced, thus seriously lowering the yield. Although it is contemplated to use a cluster tool and to form the polysilicon film and the WSi$_x$ film continuously without exposing the wafer to atmospheric air partway, it is not clear whether or not cost merits could be accrued.

Third, there is a risk of accelerated oxidation of the gate oxide film by layering of the WSi$_x$ film with the polysilicon film. In the WSi$_x$ film, a large quantity of F atoms derived from WF$_6$ as a gas of the film-forming starting material are captured, as described above. If the F atoms are diffused into the gate oxide film, the reaction shown by the equation $$SiO_2 + 2F \rightarrow SiF_2 + 2O$$

proceeds to continue capturing F atoms while releasing free oxygen. The oxygen thus released is diffused into a boundary between the gate oxide film and the polysilicon film to allow a new oxide film to grow to induce variations in the thickness of the gate oxides film, as a result of which the threshold voltage Vth of the MOS transistor is fluctuated.

Fourth, the lower layer side polysilicon film does not substantially contribute to reduction in resistance. The overall sheet resistance of the W-polycide film has a limit approximately equal to 20 ohm/□ for the film thickness of 100 nm (with the WSi$_x$ film thickness of 50 nm and the polysilicon film thickness of 50 nm). Thus the lower layer side polysilicon film is deleterious for achieving size reduction in the height-wise direction.

Fifth, since the W-polycide film has a dual-layer structure, the process is complicated or the number of process steps is inevitably increased in all steps including pre-processing, film formation and film working. This leads to increased production cost for LSI.

Thus the W-polycide film has been used at the cost of the sheet resistance or cost and suffers from peculiar problems inherent in its dual-layer structure. Therefore, if the problems such as adhesion to the SiO$_2$ film or oxidation could be solved, it is more convenient from resistance and cost considerations to employ the WSi$_x$ film alone as a gate electrode. On the other hand, the WSi$_x$ film, having a work function larger than that of the n$^+$type polysilicon film, is effective for Vth control. The same may be said of high-melting metal silicide films other than the WSi$_x$ film.

The problem of conventional Vth control by the work function is discussed.

With the dual gate type CMOS employing n$^+$and p$^+$type polysilicon films, it is possible to improve punch-through resistance by the nMOS and pMOS channel profile being of the surface channel type. However, it is still necessary to adjust the channel impurity concentration responsive to the work function of the gate electrode. In addition, if the gate length is refined up to the level of 0.1 µm, the channel impurity concentration reaches the order of $10^{18}/cm^3$, which possibly leads to deterioration of the current driving capability of the transistor.

On the other hand, the technique of employing the p$^+$-n$^+$ double gate is limited to the transistor on the SOI substrate.

On the other hand, Vth is extremely sensitive to film thicknesses of the Si or gate oxide films as the active regions, thus detracting from device design feasibility.

On the other hand, with the technique of employing the gate electrode with the use of the above-mentioned SiGe, it is difficult to control the work function in the vicinity of the mid band gap.

In addition, with the above-described technique of employing the $MoSi_x$ gate electrode, since the $MoSi_x$ film is formed by sputtering, it is not possible to prohibit increase in the metallization resistance in the step regions caused by poor step coverage or deterioration in voltage withstand characteristics of the gate oxide film caused by ion radiation damage during film formation, so that the technique is insufficient to apply to highly refined future devices.

In short, a variety of the hitherto proposed work function controlling techniques of gate electrodes of the conventional MOS transistors are not completely satisfactory for Vth control.

OBJECTS AND SUMMARY OF THE INVENTION

It is a primary object of the present invention to provide a method for forming a gate electrode of a MOS transistor wherein, if the gate electrode is formed only of refractory metal silicide film, the requirements such as low costs, low resistance, superior adhesion and high gate breakdown voltage may be met.

It is another object of the present invention to provide a method for forming a gate electrode which enables the gate electrode to be formed in a manner of enabling optimum Vth control even in a range of low channel impurity concentration through controlling the work function of the gate electrode of the MOS transistor.

According to the present invention, there is provided a method for producing an electrode comprising the steps of forming a refractory metal silicide film on a substrate by carrying out CVD using a gas mixture containing a refractory metal fluoride and a chlorosilane based compound and a step of patterning the refractory metal silicide film for forming a metallization layer.

After formation of the refractory metal silicide film, an impurity for controlling the work function may be introduced into the film and patterning may then be carried out for providing a gate electrode. If, after introducing the impurity, a barrier film is formed for preventing diffusion of the impurity on the refractory metal silicide film, and the barrier film and the refractory metal silicide film are collectively patterned in the patterning step, the impurity may be prevented from being diffused to outside even if annealing is carried out during the subsequent step. As the barrier film, a film of a metal nitride or metal oxynitride may be employed. Specific examples of these barrier film include films of nitrites or oxynitrides of Ti, W or Si.

The chlorosilane based compounds employed in the present invention include silane derivatives in which at least one of hydrogen molecules of silane ($SiH_4$) or polysilane ($Si_nH_{2n+2}$) are replaced by chlorine (Cl) atoms.

The refractory metal silicide films may be those routinely employed and may be exemplified by $WSi_x$ films, $MoSi_x$ (molybdenum silicide) films, $TiSi_x$ (titanium silicide) films or $TaSi_x$ (tantalum silicide) films.

In the step of forming the refractory metal silicide film, it is desirable to form a tungsten silicide film having the formula $WSi_x$ by CVD employing tungsten hexafluoride ($WF_6$) and dichlorosilane ($SiCl_2H_2$). The present inventors have found by experiments that, if x in the above formula is maintained at 2.7 or higher, the breakdown voltage of the extremely thin gate oxide film having a film thickness in the vicinity of 10 nm may be maintained at a satisfactory value. Up to the generation when the gate oxide film had a thickness near 10 nm, normal $WSi_x$ films formed by conventional silane reduction with x≈2.6 presented no particular problem as to the gate breakdown voltage. However, with the gate oxide film having a thickness on the order of 10 nm, satisfactory values of the breakdown voltage cannot be guaranteed. That is, the $WSi_x$ film employed in the present invention is more Si-rich than the conventional routine $WSi_x$. $x \geq 3.0$ is more preferred. There is a practical limitation to the upper limit of x, which is not specified herein, since the sheet resistance is increased if the film becomes too Si-rich.

The impurity may be introduced into the refractory metal silicide film by any of gas-phase diffusion, solid-phase diffusion or ion implantation methods. The impurity may be selectively introduced into a pre-set portion of the refractory silicide film using a mask, or a plurality of different impurities with the same or different concentrations may be introduced into different portions by ion implantation via e.g., a resist mask. If patterning is performed in each of these portions, plural gate electrodes having different work functions may be formed simultaneously.

When introducing impurity into the refractory metal silicide layer, the impurity concentration is preferably set in a range of from $10^{20}$ to $10^{22}/cm^3$. If the impurity concentration is lesser than the above range, the work function is not varied significantly, such that Vth adjustment cannot be done in a desired manner. With the impurity concentration higher than the above range, problems are raised particularly if the impurity is introduced by ion implantation. That is, if ion implantation is carried out into a thin film, such as a gate electrode, the ion accelerating energy is lowered for prohibiting punch-through towards the lower side of the gate electrode. Thus, if ion implantation is to be performed with too high a concentration, the operation becomes time-consuming to detract from the practical utility of the process. During ion implantation, a large quantity of impurities are introduced into the resist pattern used as a mask. Such resist pattern is cured due to internal cross-linking reaction, depending upon dopant types. The resist pattern, once cured, cannot be removed completely by usual $O_2$ plasma ashing. In addition, the substrate surface tends to be contaminated by popping residues resulting from explosion of the surface cured layers.

Meanwhile, the above-mentioned outward impurity diffusion may be suppressed by suitably selecting the heat-treatment method for controlling crystallinity of the high-melting metal silicide film. For this, there are two possible methods, that is a method of segregating elements not affecting the performance of the gate electrodes into a crystal grain boundary operating as a route of diffusion, for blocking the diffusion, and a method of suppressing growth of crystal grains for decreasing the grain boundary itself. The former technique may be realized by carrying out heat treatment in an atmosphere containing 10% or more of $O_2$ or $N_2$. If the amount of $O_2$ or $N_2$ in the atmosphere is less than 10%, the heat-treatment time becomes prolonged thus producing ill effects on device characteristics or through-put. There is no particular limitation to the upper limit of the $O_2$ or $N_2$ content, which may even be 100%. The latter technique may be effected after patterning the gate electrode. Heat treatment may be carried out using any customary techniques, such as furnace annealing using an electrical furnace or a rapid thermal annealing (RTA) employing a halogen lamp.

The gate electrode formed by the present invention is conveniently employed as a gate electrode for a MOS transistor. The work function of the refractory metal silicide, employed in the present invention, is generally situated in the vicinity of a Si band gap. Therefore, if the gate electrode of the MOS transistor is prepared from such material, the threshold voltage Vth of the transistor may be adjusted to a proper value without the necessity of introducing a large amount of impurity into the channel region. With the conventional MOS transistor employing a polysilicon gate electrode or a W-polycide gate electrode, it has been necessary to raise the channel impurity concentration to $10^{17}$/cm$^3$ or higher for setting the threshold voltage Vth to e.g., about 0.6 V. With the WSi$_x$ gate electrode, the channel impurity concentration on the order of $10^{16}$/cm$^3$ suffices even under the non-doped condition. It is known in general that electron mobility μn is increased with decrease in scattering by impurities and becomes substantially redoubled at room temperature. Thus it is possible with the present invention to redouble the current driving capability of the MOS transistor which is proportionate to electron mobility μn.

It is noted that O atoms in the SiO$_2$ film are bonded more strongly to the Si atoms than to W atoms in the WSi$_x$ film. Consequently, how many bonds of the Si atoms in the WSi$_x$ film can be combined with the O atoms in the SiO$_2$ represents a factor contributing to adhesion of the WSi$_x$ film to the SiO$_2$ film. The WSi$_x$ film, formed by CVD by dichlorosilane reduction, captures F atoms in an amount three digits smaller than the WSi$_x$ film (1+$10^{17}$/cm$^3$), possibly because of the high crystallinity brought about by the high film-forming temperature, so that the effective bonds of the Si atoms are consumed for F atoms to a lesser extent. Consequently, with the CVD, with which dangling bonds of Si atoms ascribable to irradiation damage are thought to be produced in a lesser amount, a WSi$_x$ having superior adhesion with respect to the Si atoms may be produced. In addition, by setting the stoichiometry of the Si atoms x relative to the W atoms to 2.7 or higher, that is by employing a composition which is more Si-rich than the conventional composition, the breakdown voltage of the gate oxide film having a thickness on the order of 10 nm can be maintained at an optimum value. Consequently, the gate electrode may be formed by only the WSi$_x$ film, which was difficult to achieve with the conventional method. In addition, since the film formed by CVD is more excellent in coverage and damaged by ion irradiation to a lesser extent than that formed by sputtering, it becomes possible to suppress resistance increase in the step portion or deterioration in dielectric strength of the gate insulating film.

On the other hand, since the WSi$_x$ film has its work function closer to the Si band gap, the MOS transistor having its gate electrode formed of the above WSi$_x$ film is low in channel impurity concentration, high in carrier mobility and excellent in current driving capability may be produced. If impurity is added further to the WSi$_x$ film, it becomes possible to control the work function in the vicinity of mid band gap to improve the performance for future devices. If the impurity is introduced in this manner, heat treatment becomes necessary as post-processing for impurity activation. If a metal nitride and/or a metal oxynitride layer is formed as a barrier film on the WSi$_x$ layer, O$_2$ or N$_2$ is segregated in the grain boundary for blocking the route of diffusion, or if heat treatment is carried out after patterning the gate electrode for suppressing crystal grain growth for maintaining the state close to the amorphous state, outward impurity diffusion may be suppressed for preventing fluctuations in the work function.

According to the present invention, since insufficient adhesion or deterioration in the gate breakdown voltage may be overcome, the gage electrode may be formed solely by the refractory metal silicide layer which it has been difficult with the conventional method. Thus it becomes possible to form a gate electrode which is lower in resistance, smaller in thickness and more suited to high integration than with the use of the conventional polycide film, with the result that the operating speed of the transistor may be improved significantly. In addition, since the film forming and working process may be simpler than with the polycide film, the production cost is not increased. Furthermore, since the threshold voltage of the transistor can be accurately controlled through controlling the work function of the gate electrode, it becomes possible to produce the high performance transistor capable of coping with future size refinement or use of a low power source voltage.

DETAILED DESCRIPTION OF THE PREFERRED EMBODIMENTS

Figure 1:
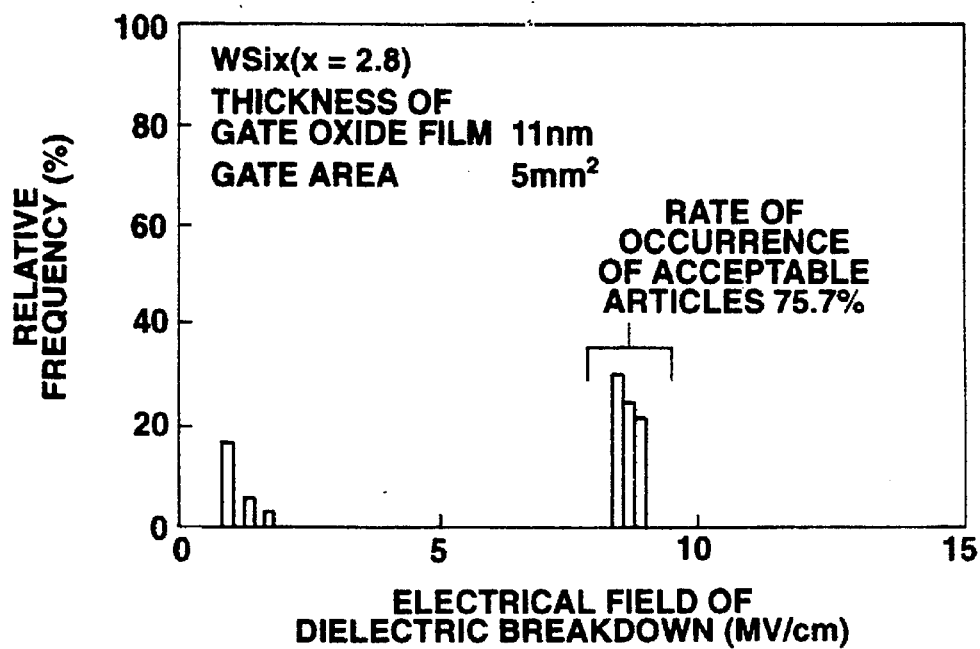
FIG. 1 is a histogram showing voltage withstand characteristics of a gate insulating film of a MOS capacitor having a WSi$_x$ (x=2.8) gate electrode produced in accordance with the present invention.

Referring to the drawings, preferred embodiments of the present invention will be explained n detail.

A first embodiment of the present invention is now explained.

In the present embodiment, a gate electrode was formed on a thin gate oxide film, using a WSi$_x$ layer having various values of the stoichiometry of Si x, for forming a gate electrode on a thin gate oxide film for constituting a MOS capacitor. The relation between the values of x and the voltage withstand characteristics of the gate oxide film was analyzed.

On an n-type Si substrate, for which device isolation has been achieved as conventionally, a gate oxide film was grown to a thickness of 11 nm by heat oxidation. The substrate was then immediately transported into the LPCVD device and WSi$_x$ film was grown by dichlorosilane reduction CVD under the film-forming conditions of the WF$_6$ flow rate of 1.6 SCCM, a SiCl$_2$H$_2$ flow rate of 80 to 160 SCCM, an Ar flow rate of 100 SCCM, a gas pressure of 40 Pa and a substrate temperature of 680° C. The stoichiometry of Si x of the $WSi_x$ film could be changed depending upon the $SiCl_2H_2$ flow rate. As the flow rate was changed from 80 SCCM through 100 SCCM, 120 SCCM and 140 SCCM up to 160 SCCM, the value of x was changed from x=2.6 through x=2.7, x=2.8 and x=2.9 to x=3.0. The $WSi_x$ layers with x=2.7 and higher, among these values of x, are covered by the present invention, and exhibit satisfactory adhesion with respect to the gate oxide film.

This $WSi_x$ layer was worked to a gate electrode having an area of 5 mm$^2$ to form a MOS capacitor in order to measure TZDB (Time Zero dielectric breakdown) of the gate oxide film. For comparison, similar measurements were made of the gate electrode prepared from a polysilicon layer in place of the $WSi_x$ layer.

Figure 2:
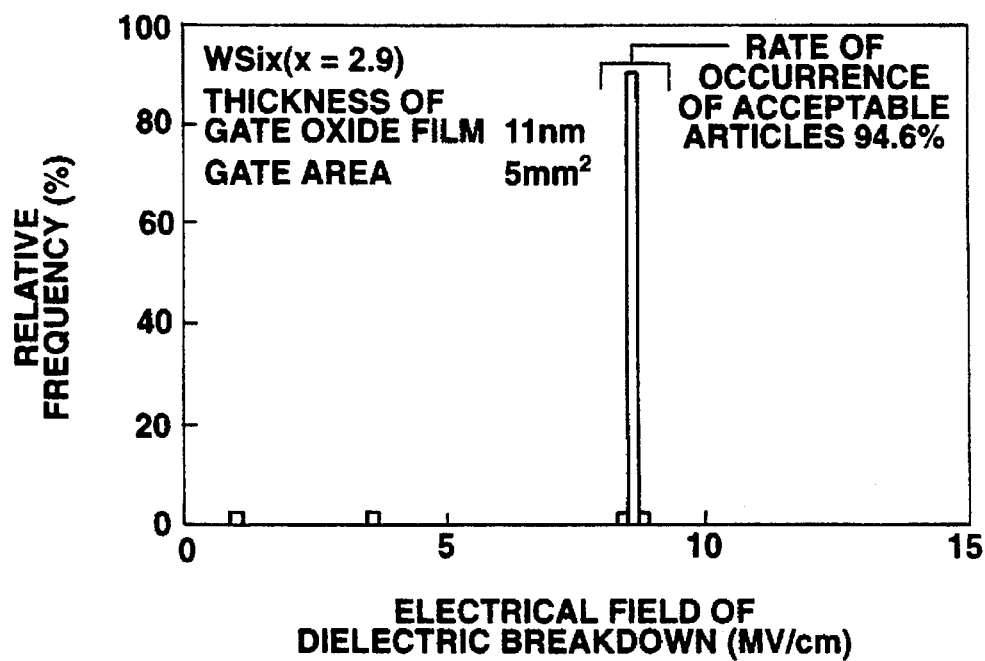
FIG. 2 is a histogram showing voltage withstand characteristics of a gate insulating film of a MOS capacitor having a WSi$_x$ (x=2.9) gate electrode produced in accordance with the present invention.
Figure 3:
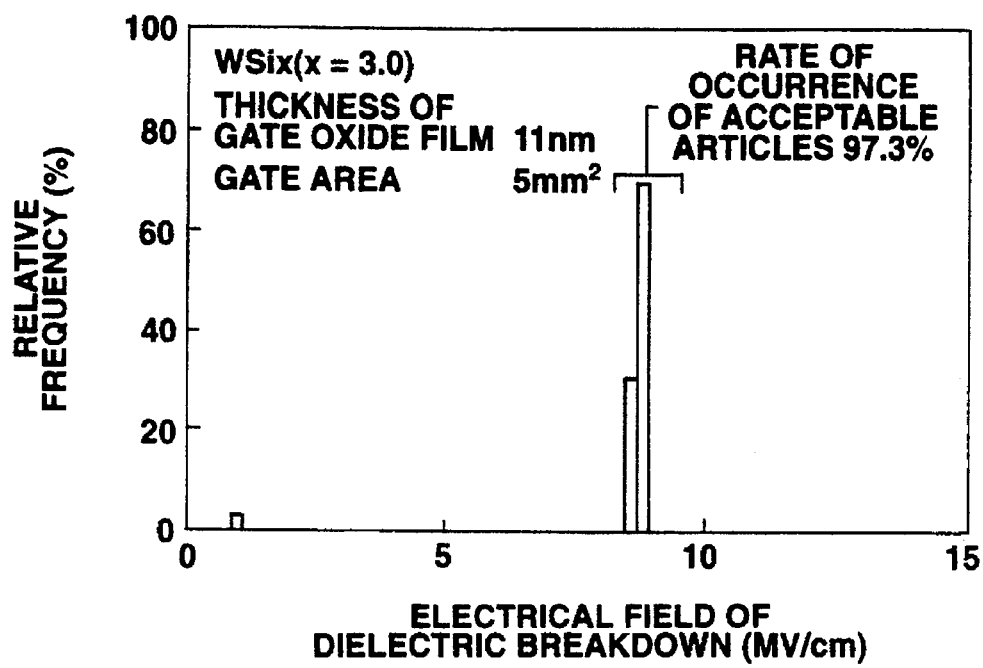
FIG. 3 is a histogram showing voltage withstand characteristics of a gate insulating film of a MOS capacitor having a WSi$_x$ (x=3.0) gate electrode produced in accordance with the present invention.
Figure 4:
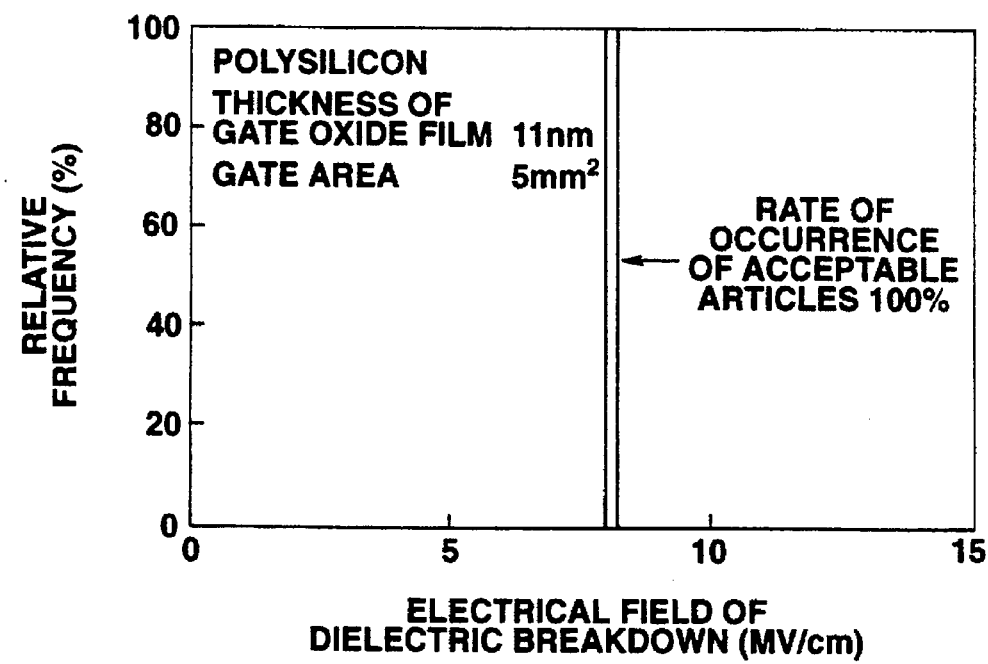
FIG. 4 is a histogram showing voltage withstand characteristics of the gate insulating film of a MOS capacitor having a conventional polysilicon gate electrode.

The results are shown in FIGS. 1 to 4 which are histograms showing relative frequencies of occurrence of the MOS capacitors which have undergone dielectric breakdown (%) on the ordinate and showing the dielectric breakdown electrical field (MV/cm) on the abscissa. FIGS. 1 to 3 show the case of using the $WSi_x$ layer of the present invention for x=2.8, x=2.9 and x=3.0 and FIG. 4 shows the case of using a polysilicon layer of the Comparative Example. The dielectric breakdown may be classified into a A-mode destruction appearing in general in a region below 1 MV/cm as a result of initial defects such as pinholes, a B-mode destruction appearing in general in a region from 1 to 5 MV/cm as a result of surface contamination or defects on the gate oxide film and a C-mode destruction appearing in a region higher than 5 MV/cm and representing inherent breakdown voltage or intrinsic breakdown voltage of the gate oxide film. The frequency of occurrence of the C-mode destruction is herein indicated as the ratio of acceptable articles.

Referring first to FIG. 4 showing a polysilicon layer of the Comparative Example, the rate of acceptable articles is 100%, indicating that this layer shows superior results in interface characteristics between it and the $SiO_2$ layer. However, there is a limitation to increasing the operating speed because of the high sheet resistance.

Conversely, with the $WSi_x$ layer of the present invention, the ratio of acceptable articles increased with rise in the value of x representing the stoichiometry of Si, and the ratio of acceptable articles as high as 97.3% was achieved for x=3.0. This is due to the fact that, due to the increased flow ratio of $SiCl_2H_2$ relative to $WF_6$ during film formation, the production ratio of the by-product HF, which accounted for deterioration of the gate breakdown voltage, was decreased.

The second embodiment of the present invention is now explained.

In the present embodiment, the gate electrode of CMOS was formed using a $WSi_x$ layer with the stoichiometry of Si x=3.0 for which the most excellent gate breakdown voltage could be achieved. This process is explained by referring to FIGS. 5A to 5E.

Figure 5A:
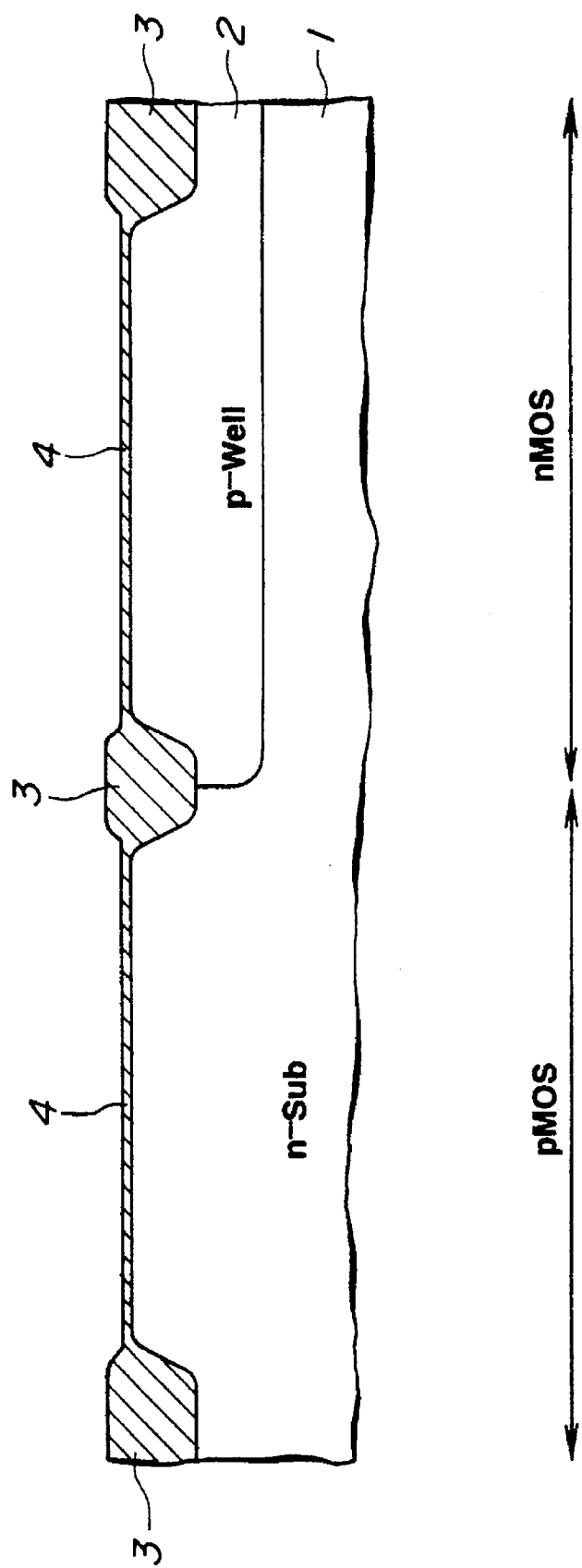
FIGS. 5A to 5E are schematic cross-sectional views showing a production process for a CMOS transistor employing WSi$_x$ for a gate according to a first embodiment of the present invention.
Figure 5B:
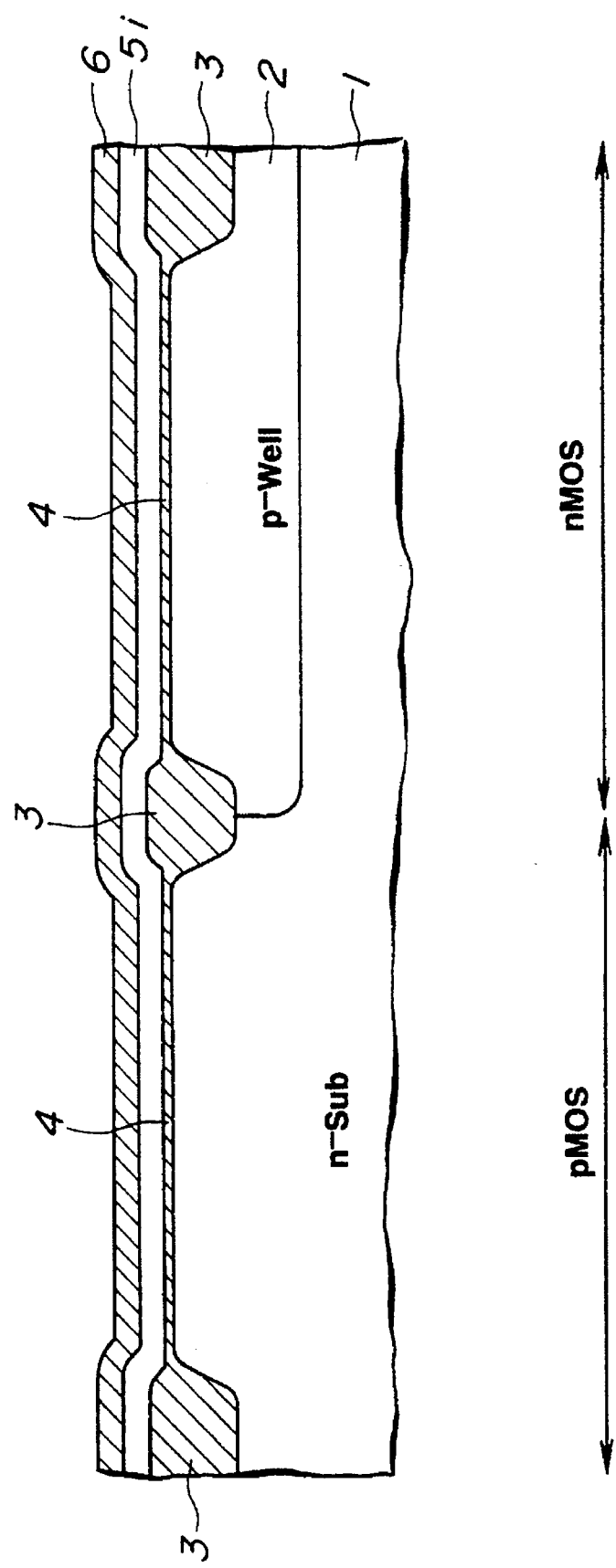

First, as shown in FIG. 5A, a p-type well 2 (p-well) was formed by high energy ion implantation and annealing in an n-type Si substrate 1 (n-sub). A device separating region 3 was then formed by the LOCOS method and a gate oxide film 4 was formed by thermal oxidation to a thickness of 11 nm.

After formation of the gate oxide film 4, the substrate was directly transferred into an LPCVD device, without carrying out pre-treatment such as mixed acid boiling, and a $WSi_x$ film was formed under illustrative conditions of the $WF_6$ flow rate of 1.6 SCCM, a $SiCl_2H_2$ flow rate of 160 SCCM, an Ar flow rate of 100 SCCM, a gas pressure of 40 Pa, a substrate temperature of 680° C. and a film forming time of 80 seconds.

Thus a $WSi_x$ film 5i, where the subscript i denotes being intrinsic, was formed on the entire substrate surface to a thickness of approximately 100 nm. The stoichiometry of Si x of the $WSi_x$ 5i was 3.0, and exhibited good adhesion with respect to the underlying gate oxide film 4.

An offset $SiO_2$ film 6 as then formed on the $WSi_x$ film 5i by plasma CVD employing e.g., a $SiH_4/O_2$ system or a $SiCl_2H_2/N_2O$ system. The offset $SiO_2$ film 6 performed the role of protecting the gate electrode 5ia of FIG. 5C from ion implantation for forming a source/drain region as later explained and the role of interrupting the gate electrode 5ia against the oxidizing atmosphere.

Figure 5C:
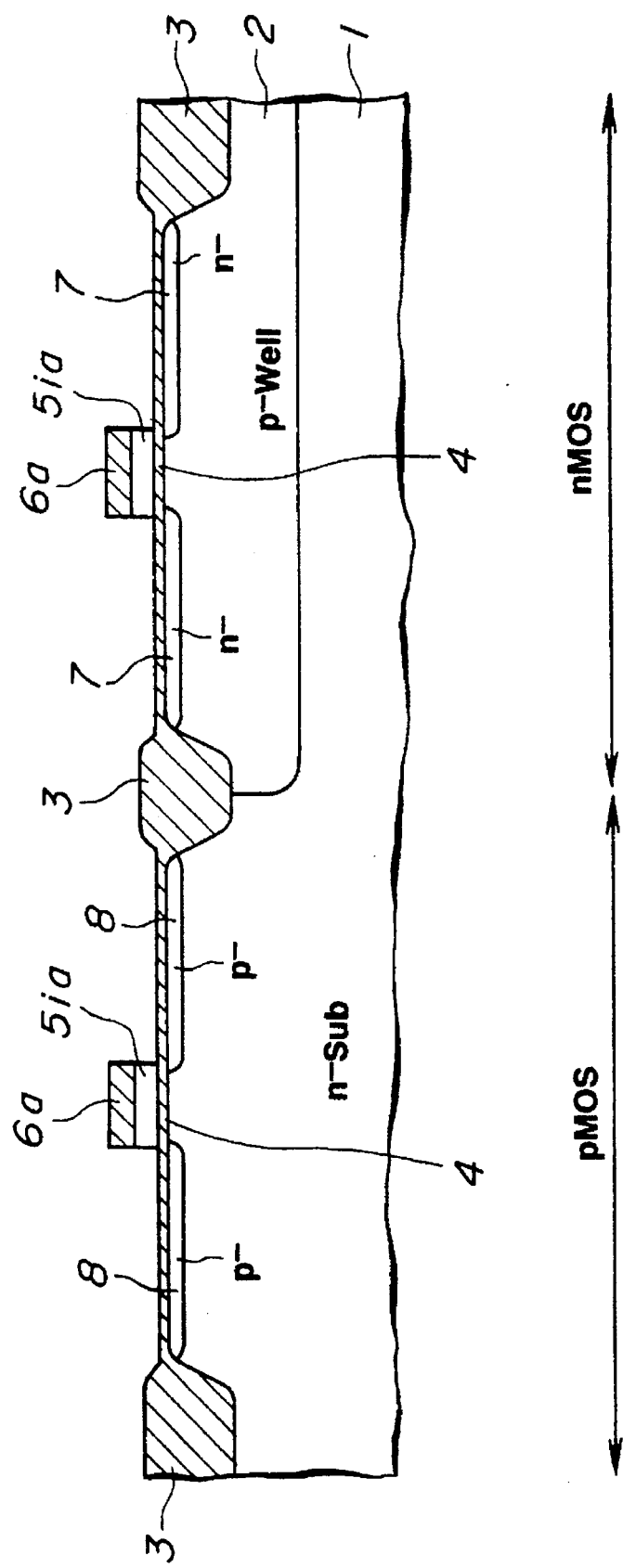

Then, using a resist mask, not shown, the offset $SiO_2$ film 6 was dry-etched, with the aid of a magnetron RIE device and a $CHF_3/O_2$ mixed gas, for forming an offset $SiO_2$ pattern 6 as shown in FIG. 5C. The subscript a denotes being anisotropically etched.

The substrate was transferred into a magnetic micro-wave plasma etching device for etching a $WSi_x$ layer 5i, using a common mask, under illustrative conditions of the $Cl_2$ flow rate of 72 SCCM, an $O_2$ flow rate of 8 SCCM, a gas pressure of 0.4 Pa, a micro-wave power of 850 W (2.45 GHz), an RF bias power of 40 W (13.56 MHz) and a substrate temperature of 0° C.

With this process, etching proceeded anisotropically, while a sidewall protecting film, not shown, composed of an etching reaction product $SiO_x$, was formed. A gate electrode 5ia having a vertical wall and a line width of approximately 0.2 μm was formed, as shown in FIG. 5C.

In the above process, the offset $SiO_2$ film 2 and the $WSi_x$ layer 5i were etched sequentially using a common resist mask. Alternatively, the resist mask may be removed after the end of etching of the offset $SiO_2$ film 6, and the $WSi_x$ layer 5i subsequently etched using the pattern of the remaining offset $SiO_2$ film 6 as a mask. In this case, since the adhesion surface of the sidewall protection film is decreased in an amount corresponding to elimination of the sidewall surface of the resist mask thus relieving the load of post-processing for removal of the sidewall protecting film and diminishing the amount of dust derived from the sidewall protecting film.

Then, using a resist mask, n-type impurity and p-type impurity were introduced by ion implantation into an n-MOS forming region and into a p-MOS forming region, respectively, for self-aligned formation of an n-type source/drain region 7 on a surface layer of the p-type well 4 and a p-type source/drain region 8 on a surface layer of the Si substrate, with respect to the gate electrode 5ia, respectively.

Figure 5D:
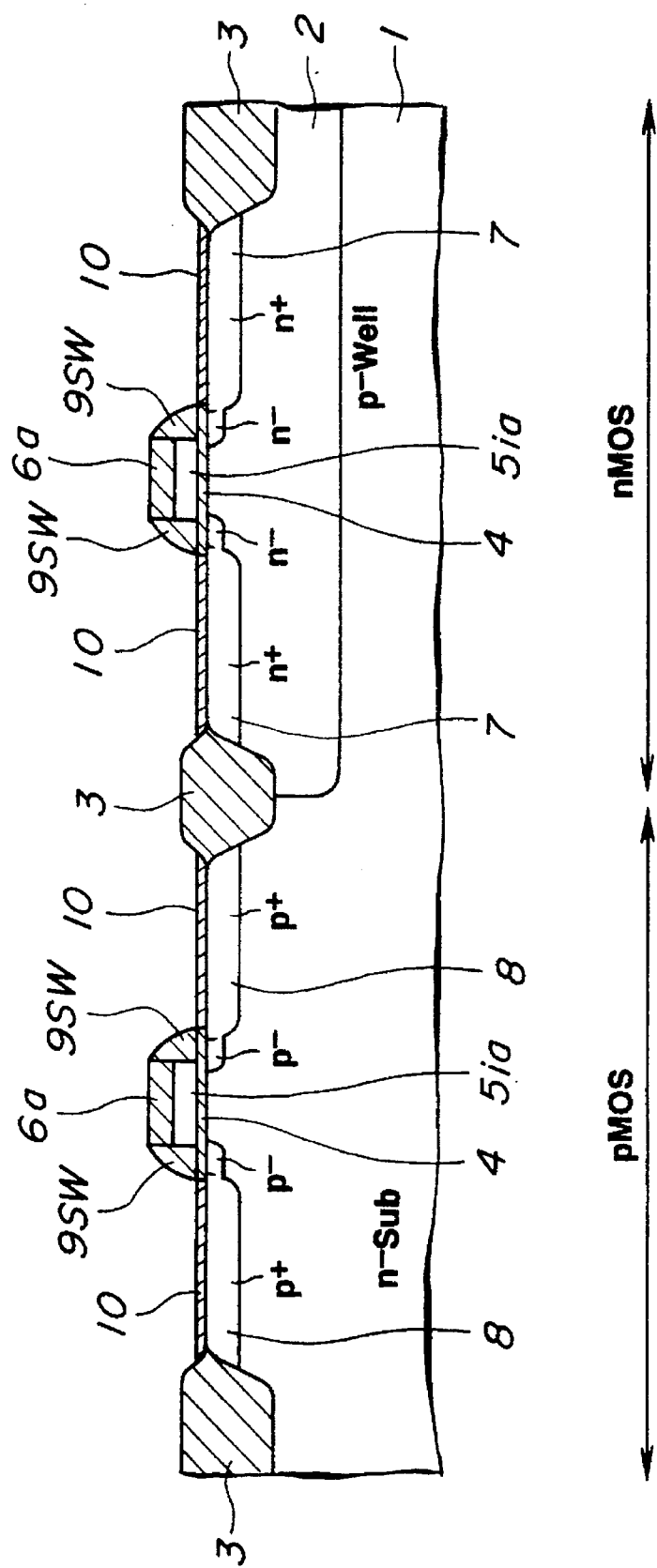

Then, as shown in FIG. 5D, a sidewall 9SW was formed on he sidewall surface of the gate electrode 5ia by deposition of a usual $SiO_2$ film on the entire substrate surface, followed by etchback. The etchback was carried out until exposure of the Si substrate 1 (inclusive of the p-type well 2). A thin $SiO_2$ film 10 about 10 nm in thickness was then formed on the exposed Si surface by thermal oxidation. This thin $SiO_2$ film 10 is provided as a channeling preventative film for ion implantation as later explained. The gate electrode 5ia is encircled during thermal oxidation by the offset $SiO_2$ film pattern 6a and the sidewall 9SW and hence is not exposed to an oxidizing atmosphere so that crack or peeling of the gate electrodes 5ia due to generation of $WO_3$ was not incurred.

Then, using a resist mask, not shown, n-type impurity and p-type impurity were introduced by ion implantation into an n-MOS forming region and an p-MOS forming region, respectively. By this ion implantation, source/drain regions 7, 8 having an LDD structure were formed in the forming region of the two MOS transistors.

Since the range of the impurities of the two ion implantation operations for the formation of the source/drain regions 7, 8 did not exceed the film thickness of the offset $SiO_2$ film pattern 6a, the gate electrodes 5ia remained unaffected. The impurities introduced by these ion implantation operations were activated by usual annealing.

Figure 5E:
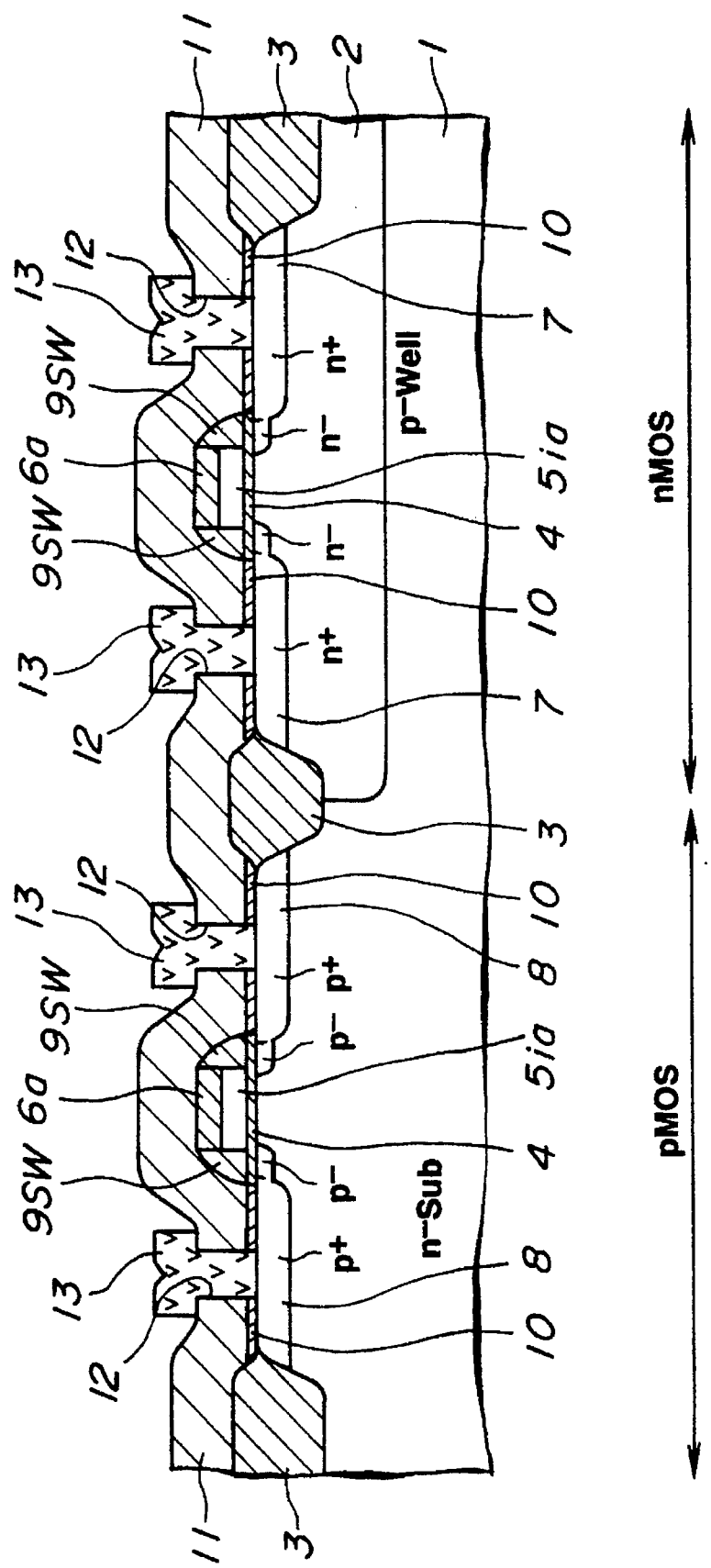

Then, as shown in FIG. 5E, an $SiO_2$ interlayer insulating film 11 was layered on the entire substrate surface and patterned for forming contact holes 12 facing the portions of the source/drain regions 7,8 and the gate electrodes 5ia which are not shown. An Al-based multi-layer film, made up of barrier metal and an Al-1%Si film, was deposited on the entire substrate surface by a usual metallization step and patterned for forming an electrode 13 for completing the CMOS.

It was then checked to which extent the operating speed of the CMOS this completed was raised as compared to that of the usual CMOS employing the conventional polysilicon gate electrode or the W-polycide gate electrode.

The sheet resistances Rs of the polysilicon film, W-polycide film and the $WSi_x$ film, each having a film thickness of 100 nm, were approximately 100 ohm/□, 20 ohm/□ and 10 ohm/□, respectively.

The signal delay time $\tau$ was tentatively calculated. The signal delay time $\tau$ is represented as the sum of the time $\tau G$ elapsed since an input signal enters the gate until the transistor is turned on, the intrinsic time $\tau i$ until turning on of the transistor and the time $\tau L$ until charging of a load capacitance $C_L$ by the on-current of the transistor. $\tau i$ may be disregarded because usually $\tau i \ll \tau G, \tau L$. The above relation may be represented by the equation (i):

$$\tau = \tau G + \tau i + \tau L \quad (1)$$
$$\approx \tau G + \tau L$$

$\tau G$ may be approximated by the product of the gate resistance $R_G$ and the gate capacitance $C_G$, while $\tau L$ may be approximated by the product of the on-resistance of the transistor and the load capacitance $C_L$. The gate resistance $R_G$ is a quantity proportionate to the sheet resistance Rs. As for the on-resistance $R_{ON}$, which is the sum of the channel resistance $R_{CH}$ and the capacitive resistance $R_{PARA}$, $R_{CH} \gg R_{PARA}$ if device characteristics are attempted to be increased by device size refinement, so that $R_{PARA}$ may be disregarded. The above relation may be represented by the following equations (2) and (3):

$$\tau G \approx R_G \times C_G \quad (2)$$
$$= \{Rs \times (W/L)\} \times C_G$$

where W and L denote gate width and gate length, respectively.

$$\tau L = R_{ON} \times C_L \quad (3)$$
$$\approx R_{CH} \times C_L$$

Therefore, $$\tau \approx \{Rs \times (W/L)\} \times C_G + (R_{CH} \times C_L) \quad (4)$$

If the W-polycide gate is changed to a $WSi_x$ mono-layer film gate, the sheet resistance Rs is changed from 20 ohm/□ to 10 ohm/□ so that Rs of the equation (4) becomes ½. As discussed previously, the current driving capability is redoubled at the maximum. This means that he channel resistance $R_{CH}$ of the equation (4) is halved. Thus the signal delay time is also halved at the maximum. Thus it is seen that the CMOS completed in the present embodiment has the operating speed about twice that of the conventional transistor at the maximum.

A third embodiment of the present invention is now explained.

In the present embodiment, the work function of each gate electrode of the nMOS and the pMOS of the second embodiment was changed by ion implantation. This process is explained by referring to FIGS. 5A and FIGS. 6A to 6D. The parts the present embodiment has in common with the second embodiment are not explained for brevity.

First, as shown in FIG. 5A, the process up to formation of the gate oxide film 4 was carried out in the same way as in the first embodiment. Ion species were ion-implanted into each channel region of the nMOS and p-MOS transistors to be formed for setting the impurity concentration of each channel region to the order of $1 \times 10^{16}/cm^3$.

Figure 6A:
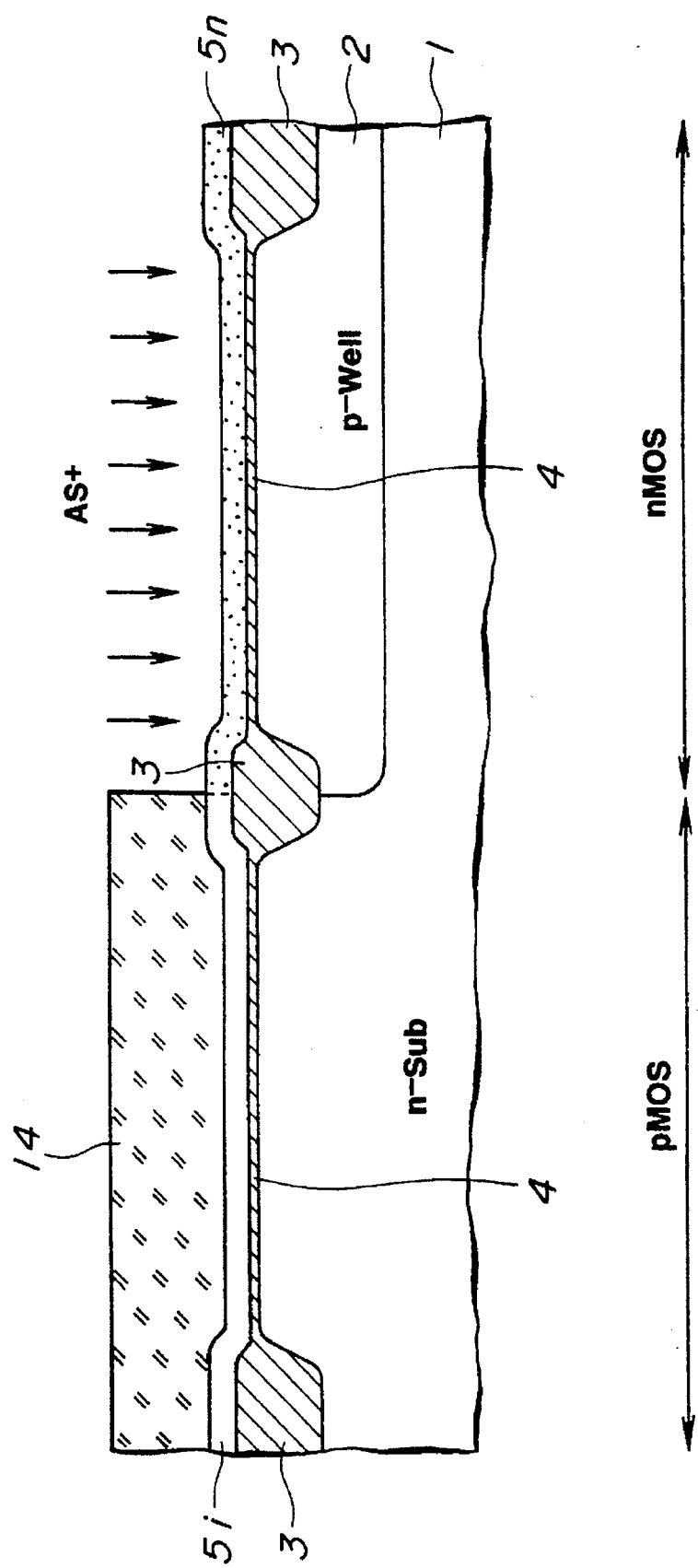
FIGS. 6A to 6D are schematic cross-sectional views showing a production process of a CMOS transistor according to a second embodiment of the present invention.

Then, as shown in FIG. 6A, the $WSi_x$ layer 5i was deposited on the entire substrate surface. The pMOS forming region of the $WSi_x$ layer 5i was covered with a resist mask 14 and arsenic ($As^+$) was ion-implanted into the exposed portion for converting it into a $n^+$type $WSi_x$ layer 5n. As the ion implantation conditions, the ion accelerating energy and the dosage were set to 20 keV and $5 \times 10^{15}/cm^3$.

Figure 6B:
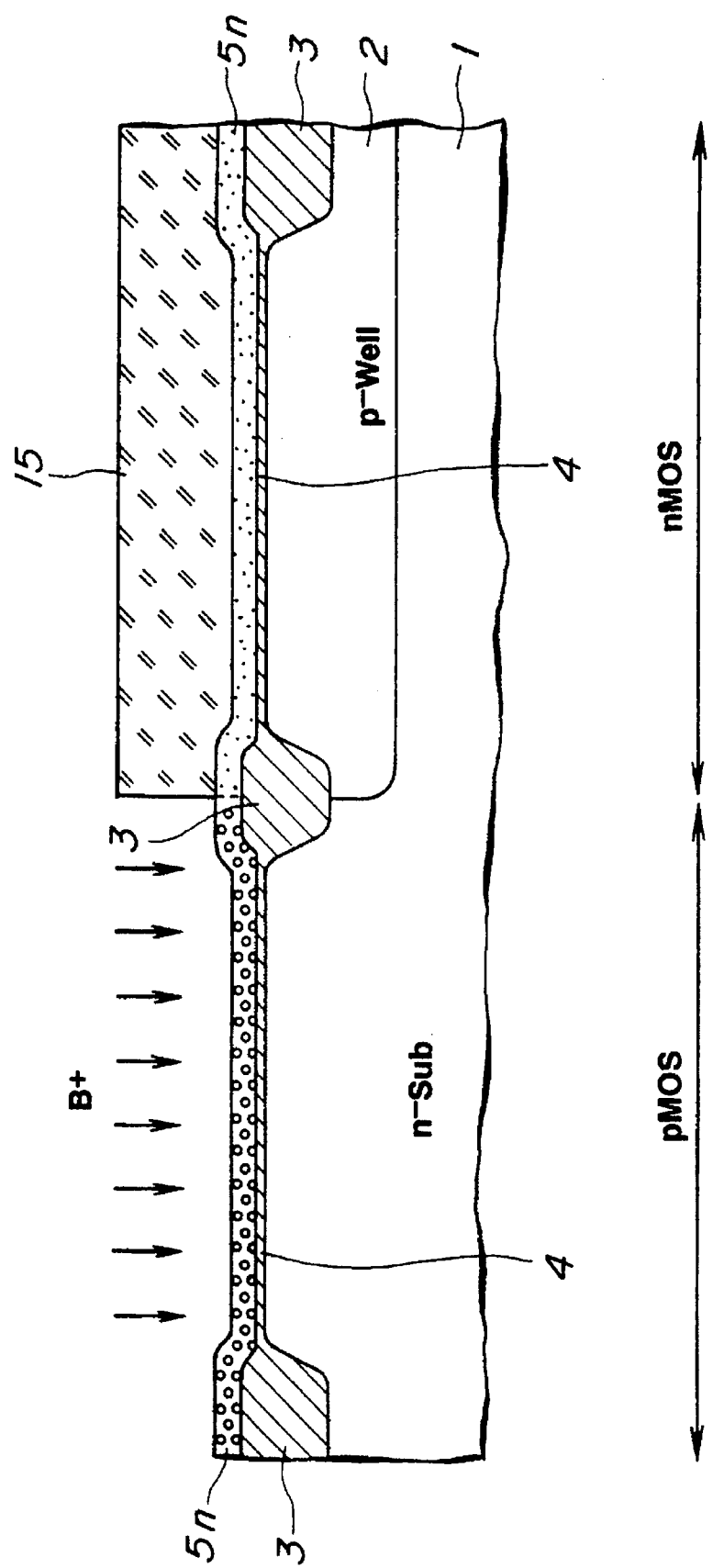

Then, as shown in FIG. 6B, the nMOS forming region was covered with a resist mask 15, and boron ($B^+$) was ion-implanted to the exposed portion for converting it into a p-type $WSi_x$ layer 5p. As the ion implantation conditions, the ion accelerating energy and the dosage were set to 15 keV and $1 \times 10^{15}/cm^3$ ($5 \times 10^{20}/cm^3$ in terms of concentration).

Figure 6C:
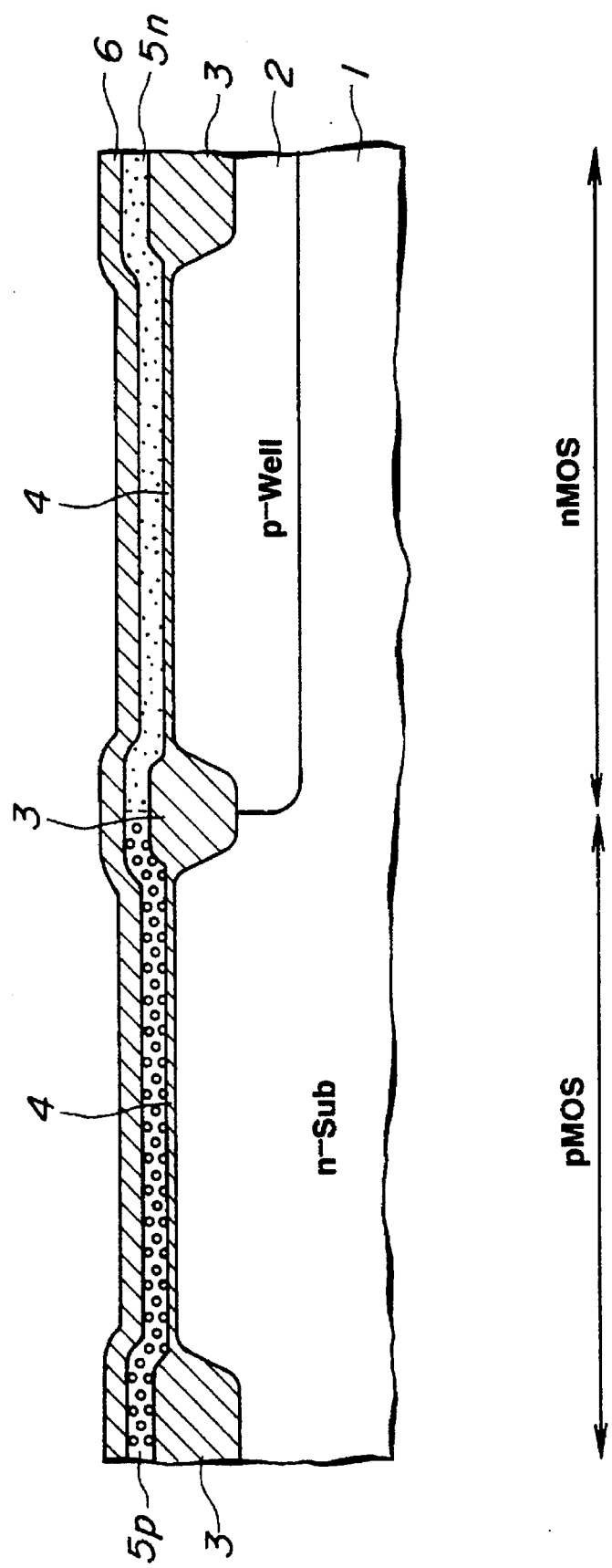

Then, as shown in FIG. 6C, an offset $SiO_2$ film 6 was deposited on the entire substrate surface.

Then, gate electrodes 5na, 5pa were formed by dry etching, and a sidewall 9SW and the source/drain regions 7, 8 were formed. Then, annealing for activation was carried out, after which an $SiO_2$ interlayer insulating film 11 were formed, contact holes 12 were formed and an electrode 13 was formed, as in the first embodiment described above.

Figure 6D:
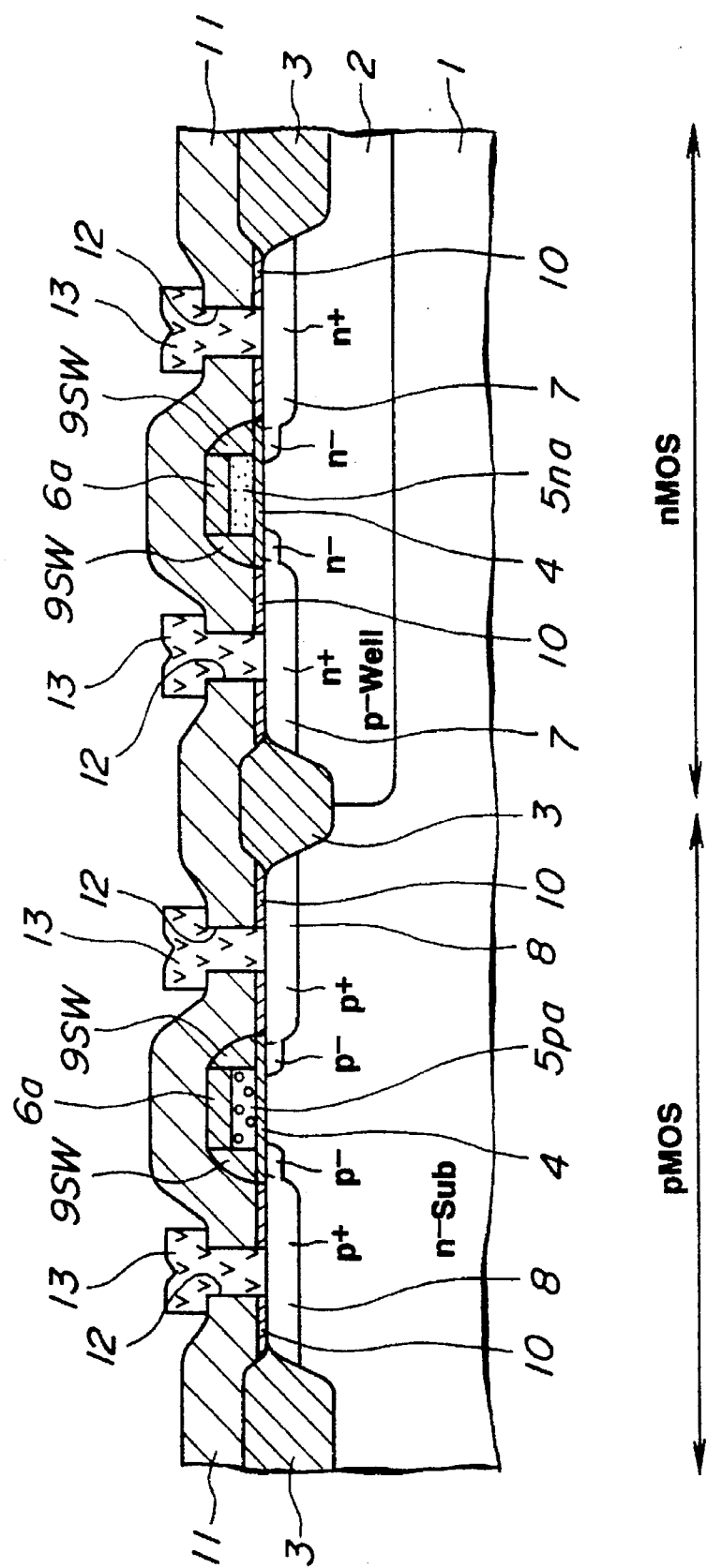

Then, for activating impurities contained in the source/drain regions 7, 8 and in the gate electrodes 5na, 5pa, the above substrate was transferred into an electrical oven and heat-treated at 850° C. for 30 minutes in a 10% dry $O_2$ atmosphere for completing the CMOS transistor shown in FIG. 6D.

With the CMOS transistor completed in the present embodiment, the work functions of the gate electrodes of nMOS and pMOS were set so as to be different by ion implantation, with Vth of the two transistors being on the order of 0.6 to 0.7. It is said in general that, for improving the operating speed in accordance with the scheduling rule, the Vth of the transistor needs to be approximately 20% or less of the source voltage. The specific value of Vth substantially satisfies this requirement even if the source voltage is lowered to 3 V in future. On the other hand, symmetry in input/output characteristics of the CMOS transistor circuit could be improved by using the symmetrical values for Vth for nMOS and pMOS.

In the present embodiment, ion implantation into the channel region and control of the work function of the gate electrode were carried out in combination. However, ion implantation to the channel region may be eliminated depending upon the work function of the gate electrode. For example, if the impurity concentration into each gate electrode of nMOS and pMOS was set to a value on the order of $1 \times 10^{21}/cm^3$, ion implantation into the channel region may be omitted.

In the present embodiment, the $n^+$type gate electrode 5na and the $p^+$type gate electrode 5pa were formed. It is however possible to form a gate electrode having a work function intermediate between that of the n⁺and p⁺types.

A fourth embodiment of the present invention will be explained.

In the present embodiment, gate electrodes 5na and 5pa were covered with an SiN film for prohibiting the impurity introduced into the WSi$_x$ layer 5i from being diffused towards outside during annealing. The process of the present embodiment is explained by referring to FIGS. 7A to 7D.

Figure 7A:
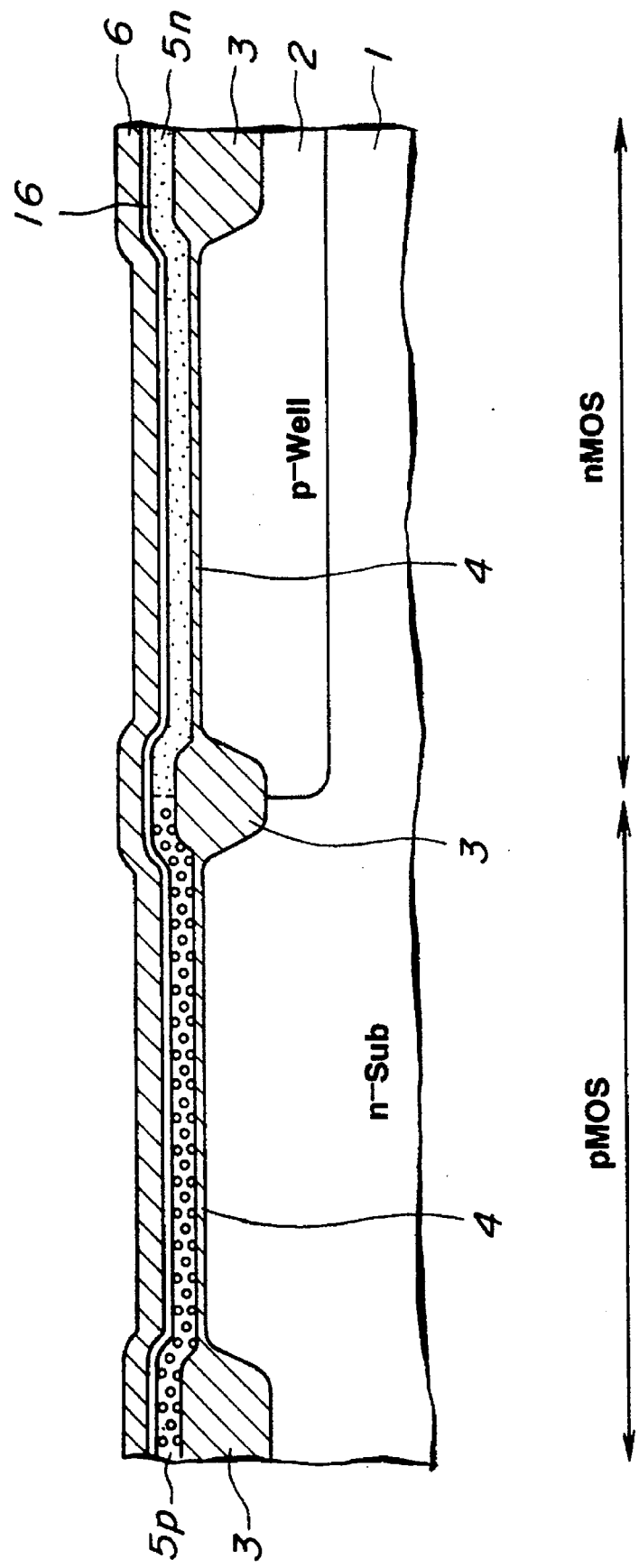
FIGS. 7A to 7D are schematic cross-sectional views showing a production process of a CMOS transistor according to a third embodiment of the present invention.

As explained in connection wit the third embodiment, n-type and p-type impurities were introduced into the WSi$_x$ layer 5i for converting the nMOS forming region and the pMOS forming region into an n⁺WSi$_x$ layer 5n and a p⁺WSi$_x$ layer 5p, after which a first SiN film 16 was deposited by LPCVD to a thickness of approximately 30 nm on the entire substrate surface and an offset SiO₂ film 16 was formed thereon to a thickness of approximately 120 nm. FIG. 7A shows the process up to this step.

Figure 7B:
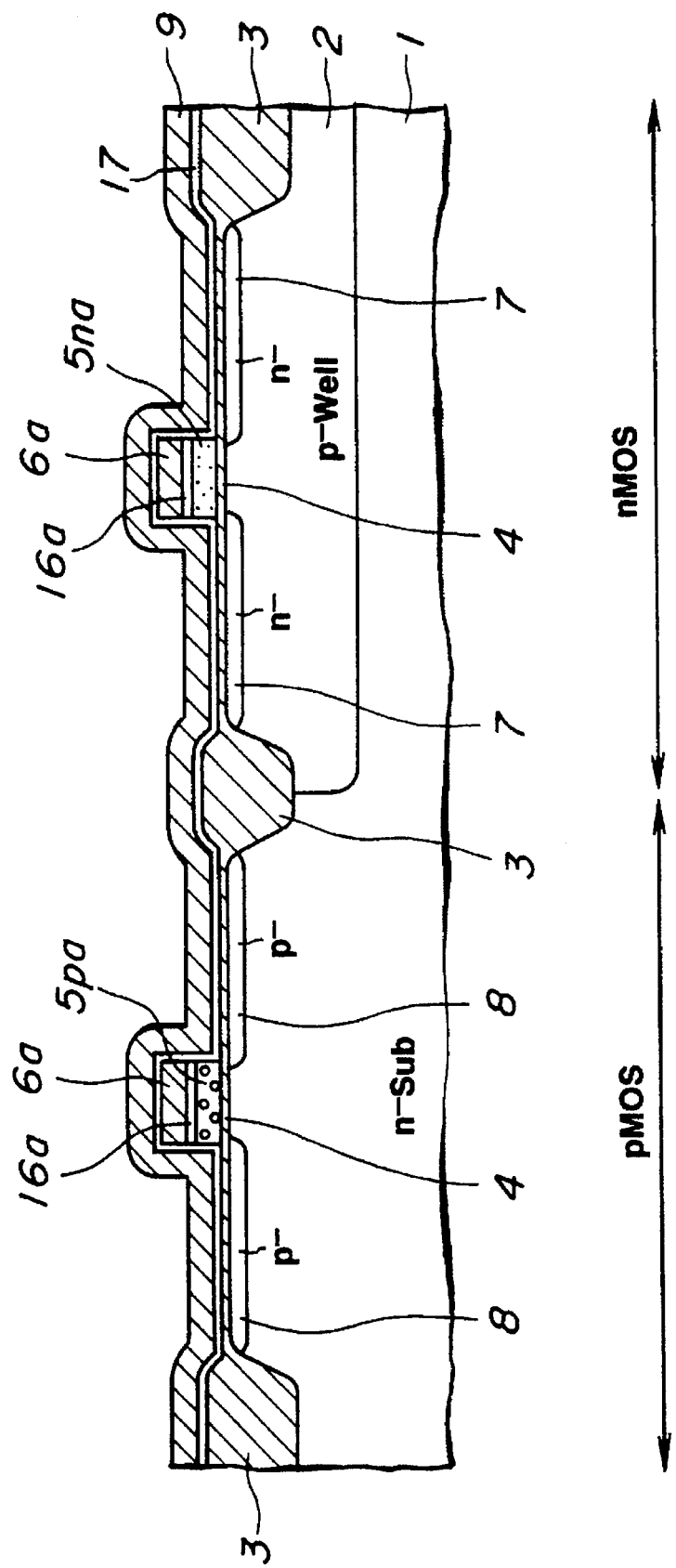

The above-mentioned offset SiO₂ film 6, a first SiN film 16, an n⁺type WSi$_x$ layer 5na and a p⁺type WSi$_x$ layer 5pa were sequentially dry-etched to form gate electrodes 5na and 5pa. Then, an n-type source/drain region 7 and a p-type source/drain region 8 were formed by ion implantation. A second SiN film 17 having a thickness of 30 nm and a sidewall forming SiO₂ film 9 having a thickness of approximately 120 nm were sequentially deposited on the entire substrate surface. FIG. 7B shows the process up to this step.

Figure 7C:
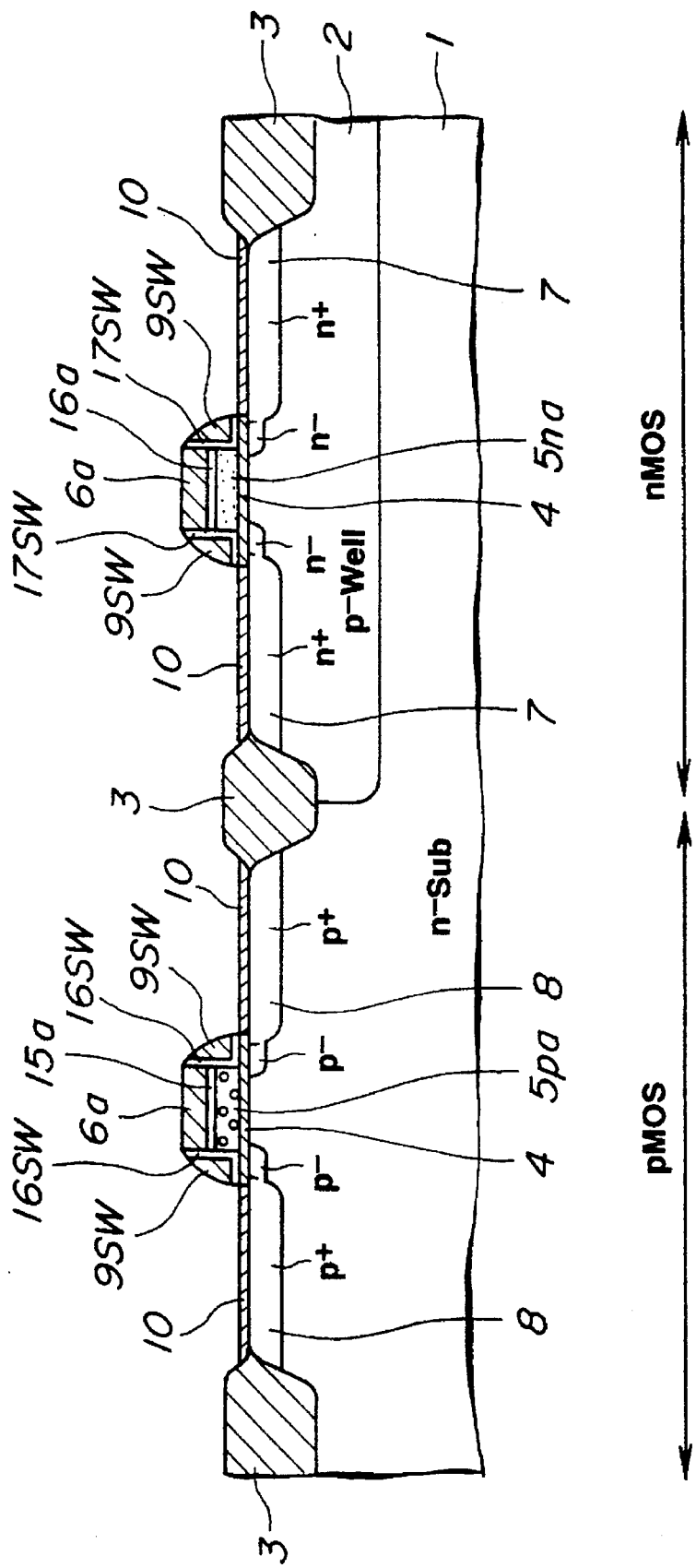

The, as shown in FIG. 7C, the sidewall forming SiO₂ film 9 and the second SiN film 17 were etched back for forming sidewalls 9SW and 17SW, after which a thin SiO₂ film 10 was formed by thermal oxidation. Ion implantation was then carried out for forming gate electrodes 5na, 5pa and source/drain electrodes 7, 8. Then, heat treatment was carried out for activating impurities in the gate electrodes 5na and 5pa and in the source/drain regions 7, 8. Since the gate electrodes 5na, 5pa are encircled by the first SiN film pattern 16a and the sidewall 17SW made up of the second SiN film, impurities were prevented from being diffused to outside. In addition, since the heat treatment is carried out after patterning the gate electrodes 5na, 5pa, crystal growth in the inside of the gate electrodes 5na, 5pa is inhibited thus contributing to suppressio of outward diffusion.

Figure 7D:
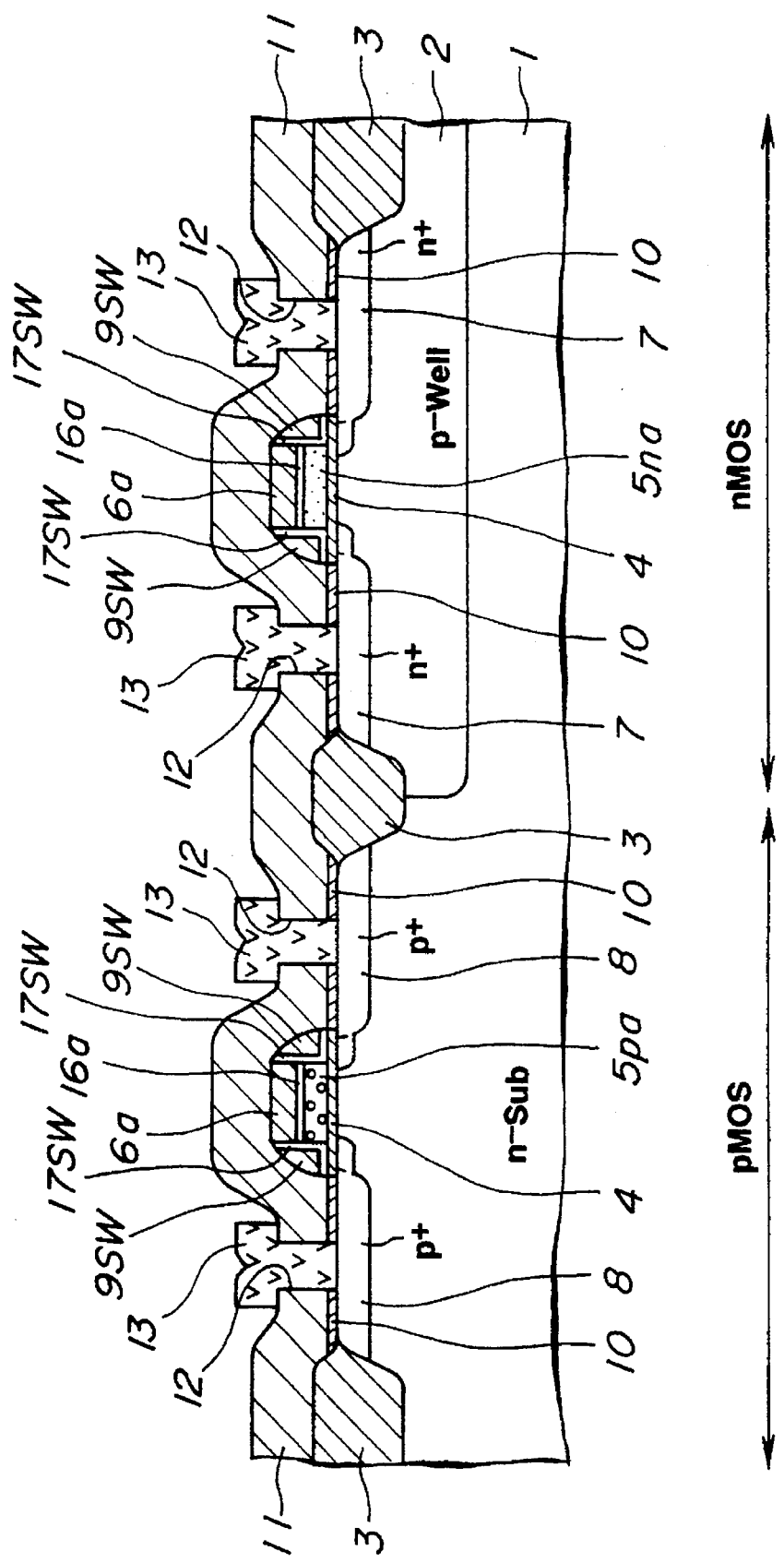

The SiO₂ interlayer insulating film 11 was formed and contact holes 12 were opened while the electrodes 13 were formed as in the third embodiment from completing the CMOS transistor as shown in FIG. 7D.

In the present embodiment, the gate electrodes 5na, 5pa were covered by the SiN film for suppressing outward diffusion of the impurities and fluctuations in the work function caused by heat treatment, thus significantly improving reliability and yield of the produced CMOS transistors.

Although the present invention has been described in connection with four preferred embodiments, the present invention is not limited to these illustrative embodiments.

For example, although only the WSi$_x$ layer has been given as the refractory metal silicide layer, similar effects may be derived by employing other known high-melting metal silicide layers. An anti-reflection film, formed e.g., of polysilicon, may be formed on the refractory metal silicide layer for improving photographic accuracy. Although an n-type Si substrate having a p-type well has been given above as a CMOS transistor substrate, it is also possible to use a p-type Si substrate having a p-type well or a v type Si substrate having both p-type and n-type wells. The order of ion implantation operations for nMOS and pMOS may be reversed from the above order. In addition, although the foregoing description has been made with the bulk type transistor in mind, the present invention may also be applied to a transistor formed on a SOI substrate.

Furthermore, the present invention may be optionally modified in connection with the design rule, details of the substrate structure, ion implantation conditions, CVD conditions or dry etching conditions.

What is claimed is:

1. A method for producing an electrode comprising the steps of:

forming a refractory metal silicide film on a substrate by carrying out chemical vapor deposition using a gas mixture containing a refractory metal fluoride and a chlorosilane based compound;

introducing impurity for controlling the work function into said refractory metal silicide film, said impurity being introduced so that the range of impurity concentration of said refractory metal silicide film is from about $10^{20}$ to $10^{22}/cm^3$;

heat treating the impurity in the refractory silicide film in an atmosphere containing not less than 10% by volume of O₂ or N₂; and patterning said refractory metal silicide film for forming a metallization layer.

2. The method as claimed in claim 1, wherein in the step of forming said refractory metal silicide film, a tungsten silicide film represented by the formula WSi$_x$, where x≧2.7, is formed using a gas mixture containing tungsten hexafluoride and dichlorosilane.

3. The method as claimed in claim 1, wherein the heat treatment is carried out after patterning said metallization layer.

4. A method for producing an electrode comprising the steps of:

forming a refractory metal silicide film on a substrate by carrying out chemical vapor deposition using a gas mixture containing a refractory metal fluoride and a chlorosilane based compound;

introducing impurity for controlling the work function into said refractory metal silicide film, said impurity being introduced so that the range of impurity concentration of said refractory metal silicide film is from about $10^{20}$ to $10^{22}/cm^3$;

heat treating the impurity in the refractory silicide film in an atmosphere containing not less than 10% by volume of O₂ or N₂;

forming a barrier film for preventing diffusion of the impurity in said refractory metal silicide; and collectively patterning said barrier film and said refractory metal silicide film for forming a metallization layer.

5. The method as claimed in claim 4, wherein in the step of forming said refractory metal silicide film, a tungsten silicide film represented by the formula WSi$_x$, where x≧2.7, is formed using a gas mixture containing tungsten hexafluoride and dichlorosilane.

6. The method as claimed in claim 4, wherein the heat treatment is carried out after patterning said metallization layer.

7. The method as claimed in claim 4, wherein said electrode is a gate electrode of a MOS transistor.

8. A method as defined in claim 1, wherein in said heat-treating step the substrate is heated to about 850° C. for about 30 minutes.

9. A method as defined in claim 4, wherein in said heat-treating step the substrate is heated to about 850° C. for about 30 minutes.

* * * * *